United States Patent
Clark, Jr. et al.

(10) Patent No.: US 7,378,357 B2
(45) Date of Patent: May 27, 2008

(54) MULTIPLE DIELECTRIC FINFET STRUCTURE AND METHOD

(75) Inventors: William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 11/264,446

(22) Filed: Nov. 1, 2005

(65) Prior Publication Data

US 2006/0054978 A1    Mar. 16, 2006

Related U.S. Application Data

(62) Division of application No. 10/708,674, filed on Mar. 18, 2004, now Pat. No. 7,115,947.

(51) Int. Cl.
*H01L 21/8234* (2006.01)

(52) U.S. Cl. .................. 438/778; 438/761; 438/275; 438/300; 257/347; 257/401; 257/E27.112

(58) Field of Classification Search ............ 438/778, 438/761, 275, 981, 300; 257/401, 347, E27.112
See application file for complete search history.

(56) References Cited

U.S. PATENT DOCUMENTS

| | | | |
|---|---|---|---|
| 6,087,225 | A | 7/2000 | Bronner et al. |
| 6,413,802 | B1 | 7/2002 | Hu et al. |
| 6,417,037 | B1 | 7/2002 | Feng |
| 6,433,609 | B1 | 8/2002 | Voldman |
| 6,787,439 | B2 | 9/2004 | Ahmed et al. |
| 6,858,478 | B2 | 2/2005 | Chau et al. |
| 2002/0004277 | A1 | 1/2002 | Ahn et al. |
| 2002/0190333 | A1 | 12/2002 | Lin et al. |
| 2005/0040444 | A1 | 2/2005 | Cohen |
| 2005/0110085 | A1 | 5/2005 | Zhu et al. |

*Primary Examiner*—Stephen W Smoot
*Assistant Examiner*—Colleen E Rodgers
(74) *Attorney, Agent, or Firm*—Gibb & Rahman, LLC; William D. Sabo, Esq.

(57) ABSTRACT

Disclosed is a method and structure for a fin-type field effect transistor (FinFET) structure that has different thickness gate dielectrics covering the fins extending from the substrate. These fins have a central channel region and source and drain regions on opposite sides of the channel region. The thicker gate dielectrics can comprise multiple layers of dielectric and the thinner gate dielectrics can comprise less layers of dielectric. A cap comprising a different material than the gate dielectrics can be positioned over the fins.

17 Claims, 7 Drawing Sheets

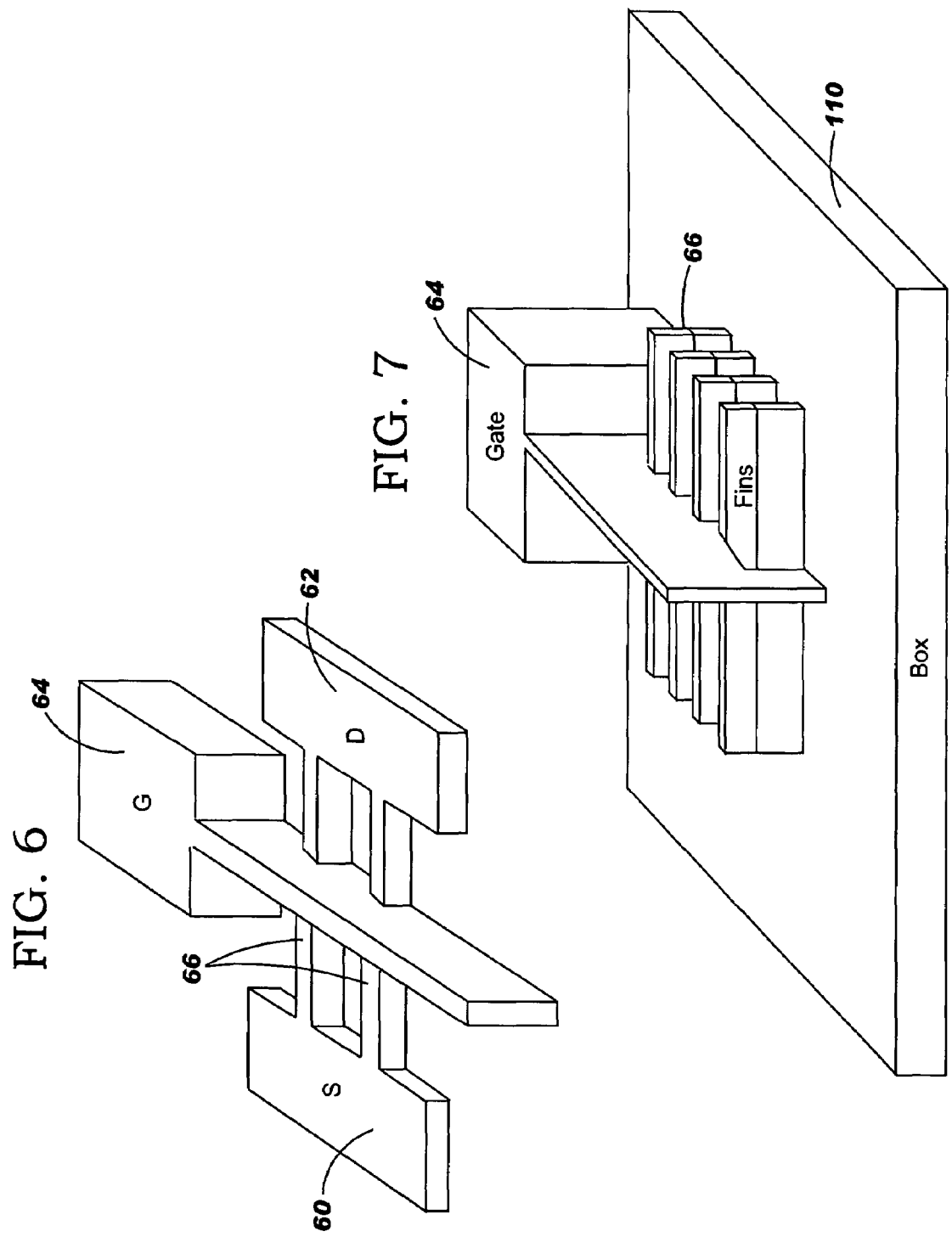

MULTIPLE DIELECTRIC FINFET STRUCTURE AND METHOD

CROSS REFERENCE TO RELATED APPLICATIONS

This application is a divisional application of U.S. Ser. No. 10/708,674, filed Mar. 18, 2004 now U.S. Pat. No 7,115,947.

BACKGROUND OF THE INVENTION

1. Field of the Invention

The present invention generally relates to Fin-type field effect transistors (FinFET) and more particularly to an improved FinFET structure that includes multiple gate dielectric thicknesses.

2. Description of the Related Art

As the need to decrease the size of transistors continues, new and smaller types of transistors are created. One recent advance in transistor technology is the introduction of fin type field effect transistors that are known as FinFETs. U.S. Pat. No. 6,413,802 to Hu et al. (hereinafter "Hu patent"), which is incorporated herein by reference, discloses a FinFET structure that includes a center fin that has a channel along its center and source and drains at the ends of the fin structure. A gate conductor covers the channel portion.

While FinFETs structures reduce the size of transistor-based devices, it is still important to continue to improve FinFETs. The invention described below provides a method and structure which improves the performance of FinFETs.

SUMMARY OF THE INVENTION

The invention provides a method of forming a fin-type field effect transistor (FinFET) structure that begins by patterning fins on a substrate and forming a first gate dielectric on the fins. Then, the invention protects first fins using a mask and removes the first gate dielectric from unprotected second fins. After removing the mask from the first fins, the invention forms an additional gate dielectric on the second fins and on the first gate dielectric that covers the first fins. This forms different thicknesses of gate dielectrics on the first fins when compared to the second fins. This process also forms multiple layers of dielectric over the first fins and forms the additional gate dielectric only over the second fins.

Processing steps used to complete the FinFET structure include doping ends of the fins to form source and drain regions separated by a central channel regions of the fins, and forming a gate conductor over the channel regions. The gate dielectrics insulate the channel regions from the gate conductor.

The invention can utilize the fins in different types of transistors on the substrate. In this situation, one type of transistor would include gate dielectrics having a first thickness and a second type of transistor would include gate dielectrics having a second thickness different than the first thickness. Also, the invention can utilize the fins in multiple-fin transistors.

This process produces a fin-type field effect transistor (FinFET) structure that has different thickness gate dielectrics covering the fins extending from the substrate. These fins have a central channel region and source and drain regions on opposite sides of the channel region. Again, the thicker gate dielectrics can comprise multiple layers of dielectric and the thinner gate dielectrics comprise less layers of dielectric. A cap comprising a different material than the gate dielectrics can be positioned over the fins.

The use of different voltage ranges on separate regions of circuit areas (core, I/O, capacitors, etc.) requires different dielectric thickness to optimize device performance and reliability. This invention proposes a multi-thickness dielectric FinFET structure and method to map this into future technologies. This invention uses multiple gate dielectrics on FinFET designs to optimize device performance/reliability and a method to fabricate them. By using a multiple dielectric design the invention avoids the density and performance penalties associated with complicated stacking schemes designed to keep device electric fields within the thinner dielectric imposed limits. This invention also extends the scaling capabilities of FINFETs.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 6 is a schematic diagram of a partially completed FinFET structure;

FIG. 7 is a schematic diagram of a partially completed FinFET structure; and

DETAILED DESCRIPTION OF PREFERRED EMBODIMENTS OF THE INVENTION

Figure 1:
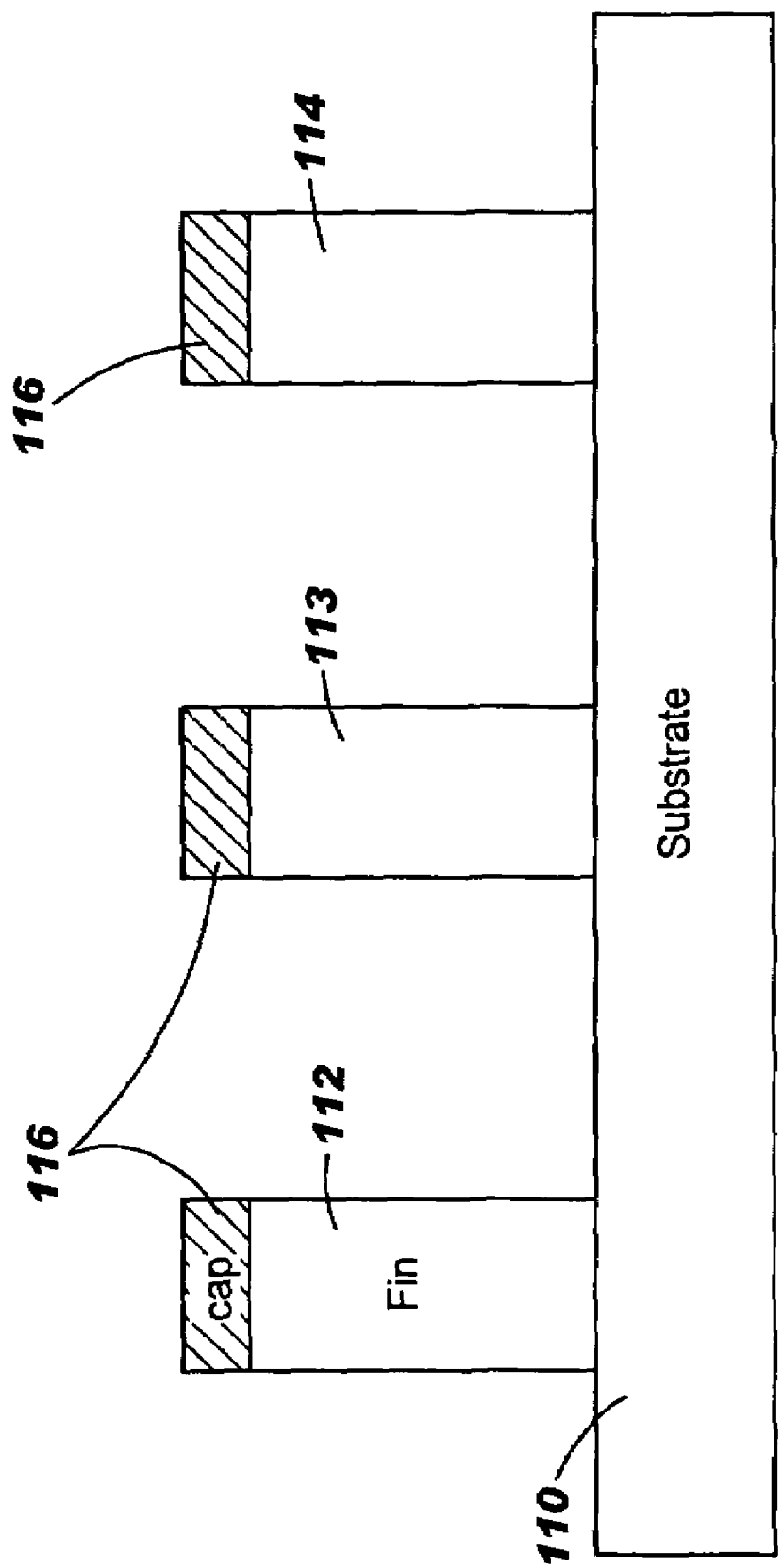
FIG. 1 is a schematic diagram of a partially completed FinFET structure.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 5:
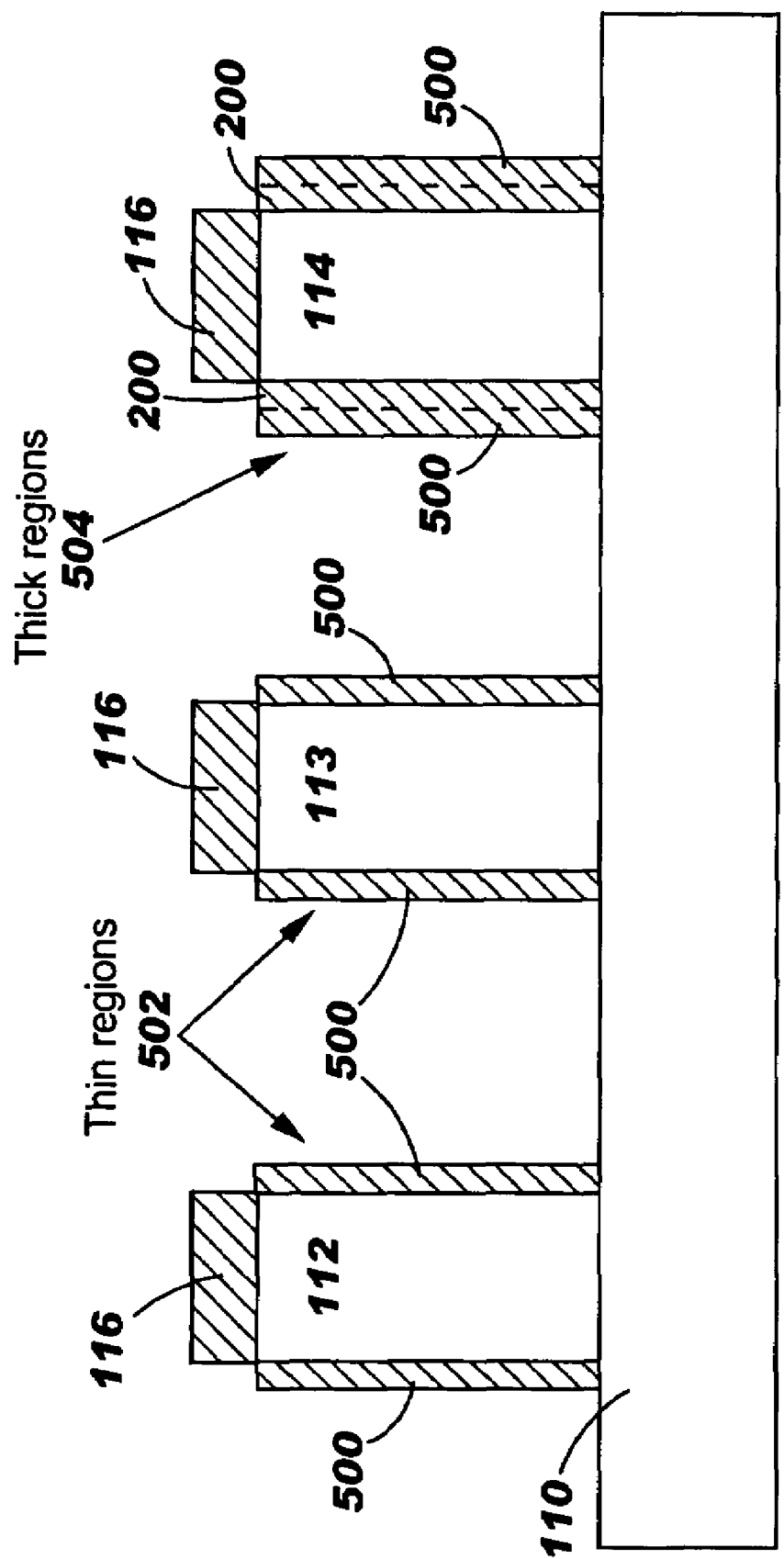
FIG. 5 is a schematic diagram of a partially completed FinFET structure.

As shown in FIG. 5, one embodiment of the invention provides a fin-type field effect transistor (FinFET) structure that has different thickness gate dielectrics 502, 504 covering the fins 112-114 extending from the substrate 110. The thicker gate dielectrics 504 can comprise multiple layers of dielectric (200 and 500) and the thinner gate dielectrics 502 comprise less layers of dielectric (only 500). In addition, the fins 114 that have additional dielectric layers 200 will be smaller (more narrow) because the additional dielectric oxide 200 processing consumes more of the fin width of the fins 114 when compared to the other fins 112, 113. A cap 116 comprising a different material than the gate dielectrics can be positioned over the fins 112-114. As shown in FIG. 6, the fins 66 have a central channel region covered by a gate conductor 64, and source 60 and drain 62 regions on opposite sides of the channel region.

Figure 2:
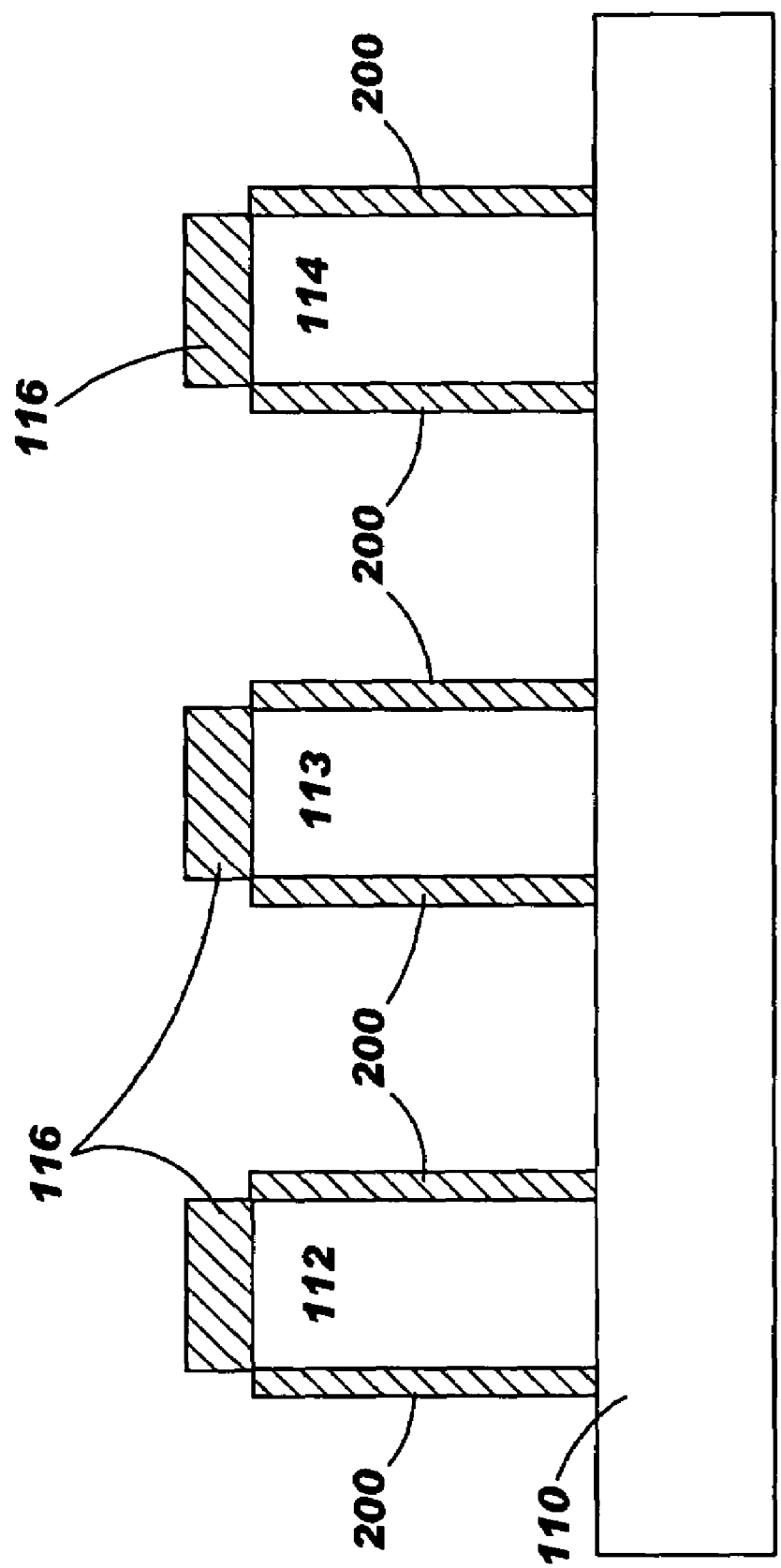
FIG. 2 is a schematic diagram of a partially completed FinFET structure.
Figure 3:
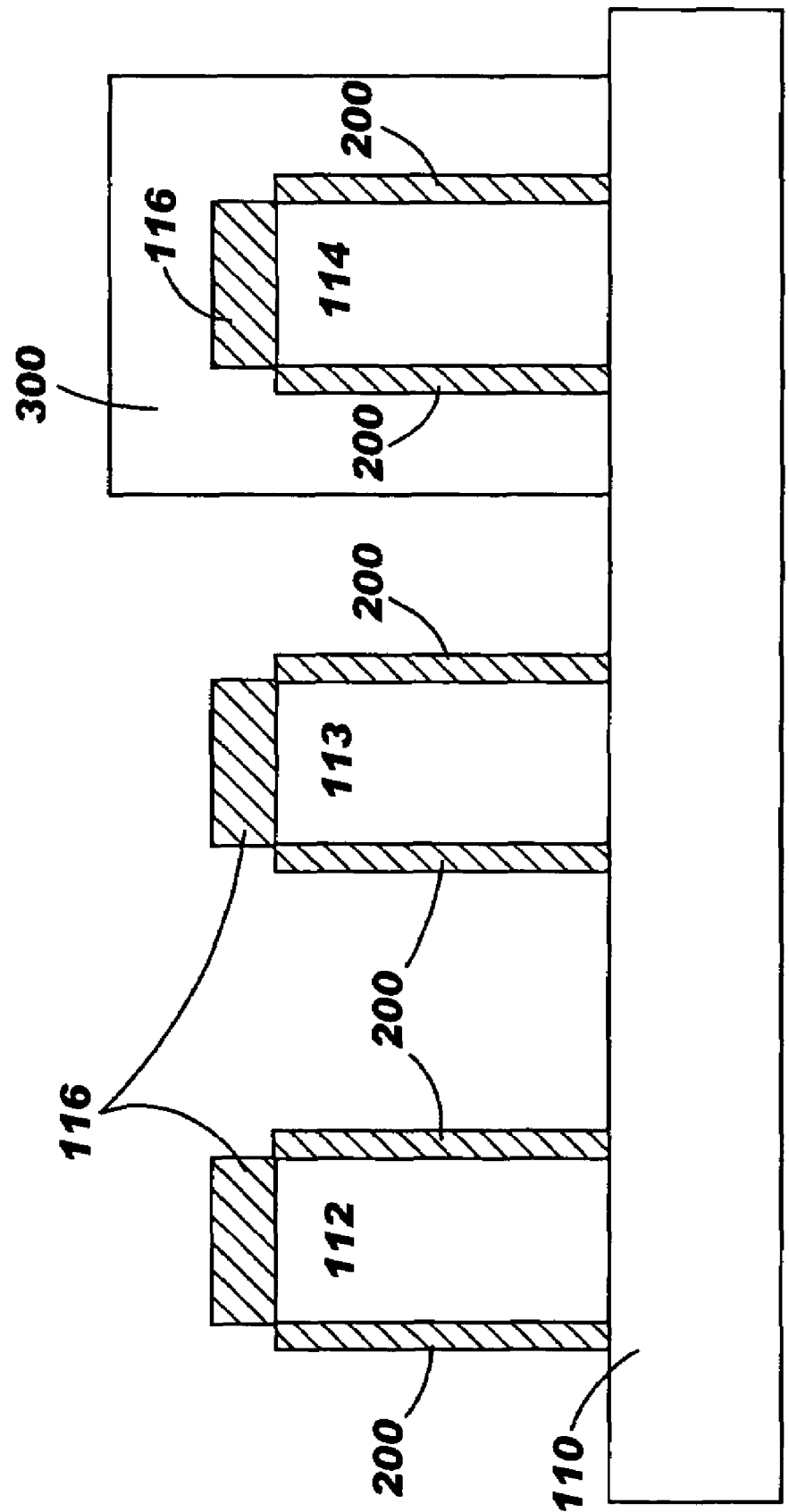
FIG. 3 is a schematic diagram of a partially completed FinFET structure.
Figure 4:
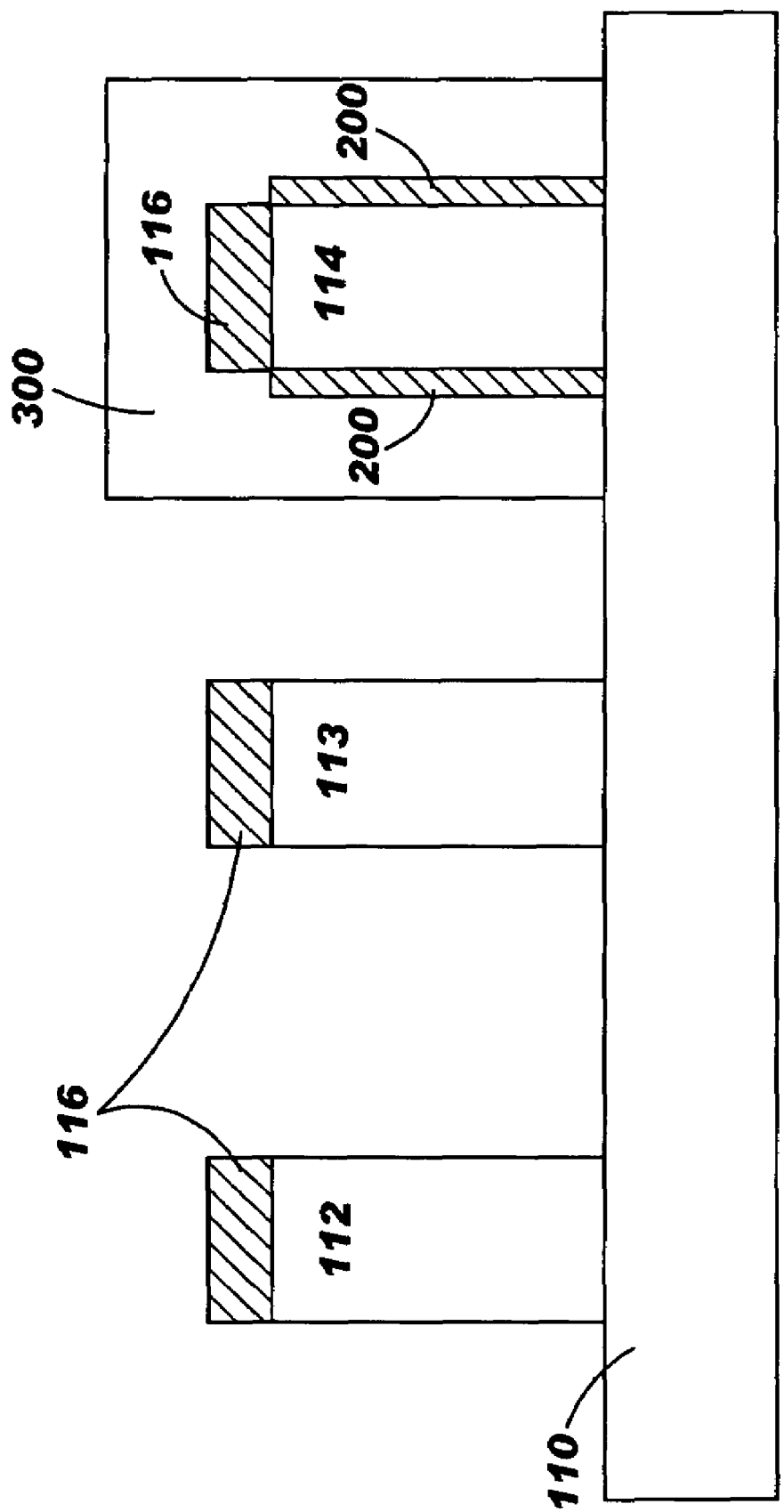
FIG. 4 is a schematic diagram of a partially completed FinFET structure.

FIGS. 1-5 illustrate one exemplary methodology utilized to form the inventive structure. More specifically, FIG. 1 illustrates fins 112-114 and caps 116 patterned on a substrate 110. FIG. 2 illustrates a first gate dielectric 200 that is grown on the fins 112-114. Then, the invention protects first fins 114 using a mask 300, as shown in FIG. 3. In FIG. 4, the invention removes the first gate dielectric from unprotected second fins 112, 113. After removing the mask from the first fins (as shown and FIG. 5), the invention forms an additional gate dielectric 500 on the second fins 112, 113 and on the first gate dielectric 200 that covers the first fins 114. Again, the fins 114 that have additional dielectric layers 200 will be smaller (more narrow) because the double dielectric oxide 200, 500 processing consumes more of the fin width of the fins 114, when compared to the single dielectric oxide 500 processing performed on fins 112, 113.

This forms different thicknesses of gate dielectrics 504 on the first fins 114 when compared to the thickness of the dielectrics 502 on the second fins 112, 113 (as well as different width fins). This process also forms multiple layers of dielectric 200, 500 over the first fins 114 and forms only the additional gate dielectric 500 over the second fins.

As shown in FIGS. 6 and 7, additional processing steps, such as those described in the Hu patent are used to complete the FinFET structure. For example, the ends of the fins 66 are doped to form source 60 and drain 62 regions separated by a central channel region. Gate conductors 64 are formed over the channel regions of the fins 66. The gate dielectrics 200, 500 insulate the channel regions from the gate conductor 64.

While a limited number of types of FinFETs are shown in the drawings, one ordinarily skilled in the art would readily understand that the invention can utilize the fins in many different types of transistors on the substrate. For example, the invention can form complementary transistors on the same substrate, or can form transistors with different voltage requirements on different areas of the substrate. Therefore, in these situations, certain types of transistor would include gate dielectrics having a first thickness and other types of transistor could include gate dielectrics having a second thickness. Also, the invention can utilize the fins in multiple-fin transistors. Further, one ordinarily skilled in the art would clearly understand that the invention is not limited to only two different thicknesses of gate dielectrics. To the contrary, any number of gate dielectric thicknesses can be formed with the invention by simply repeating the masking and depositing processes shown in FIGS. 3-5.

Figure 8:
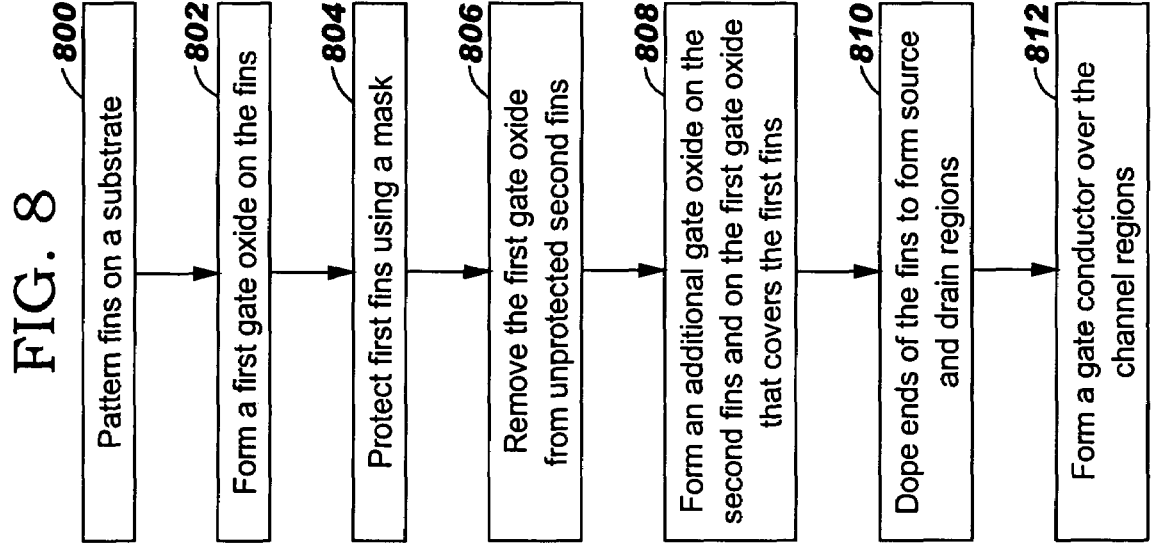
FIG. 8 is a flow diagram illustrating a preferred method of the invention.

FIG. 8 illustrates the methodology of the invention in flowchart form. More specifically, in item 800, the invention patterns fins on a substrate and in item 802, the invention forms a first gate dielectric on the fins. Then, the invention protects first fins using a mask (804) and removes the first gate dielectric from unprotected second fins 806. After removing the mask from the firstced fins, the invention forms an additional gate dielectric on the second fins and on the first gate dielectric that covers the first fins 808. This forms different thicknesses of gate dielectrics on the first fins when compared to the second fins. For example, one gate dielectric could be more than twice as thick as the other gate dielectric. This process also forms multiple layers of dielectric over the first fins and forms only the additional gate dielectric over the second fins. Forming n layers on one set of FINs, n-1 on another set, n-2 on a third set etc., so the process is repeatable and flexible. Processing steps used to complete the FinFET structure include doping ends of the fins to form source and drain regions 810 separated by a central channel regions of the fins, and forming a gate conductor over the channel regions 812.

In addition, while one methodology is discussed above, variations on this methodology are intended to be included within the invention. For example, while FIG. 4 illustrates the removal of the first gate dielectric 200 from selected fins, the inventive process can instead selectively retard oxide growth in one set of FINS (112 and 113) (for example by N2 implantation into the Fin sidewall) and then perform a single oxidation which would yield a first thickness on 112/113 and a second thickness (thicker film) on 114. Another aspect of the invention is that after growing layer 200 and protecting FINs 114 the invention etch off layer 200 on FINS 112-113. This has the effect of thinning the body of 112 and 113 as the grown oxide (200) consumes silicon during the growth phase. After layer 500 is grown the FIN bodies of 112 and 113 are thinner than 114 which is scaled in the correct direction, i.e. for higher voltages it is desirable to have a thicker oxide and thicker FIN body.

Additionally, any type of dielectric that functions properly as a gate dielectric can be used including oxides, nitrides, glasses, silicone, or any of the class of hi-K dielectrics etc. One ordinarily skilled in the art would understand that additional similar methodologies could be employed within the spirit and scope of the invention.

The use of different voltage ranges on separate regions of circuit areas (core, I/O, capacitors, etc.) requires different dielectric thickness to optimize device performance and reliability. This invention discloses a multi-thickness dielectric FinFET structure and method to map this into future technologies. This invention uses multiple gate dielectrics on FinFET designs to optimize device performance/reliability and a method to fabricate them. By using a multiple dielectric design, the invention avoids the density and performance penalties associated with complicated stacking schemes designed to keep device electric fields within the thinner dielectric imposed limits. This invention also extends the scaling capabilities of FinFETs.

While the invention has been described in terms of preferred embodiments, those skilled in the art will recognize that the invention can be practiced with modification within the spirit and scope of the appended claims.

What is claimed is:

1. A method of forming a fin-type field effect transistor (FinFET) structure, said method comprising:

patterning fins on a substrate;

forming a first gate dielectric on said fins;

protecting first fins using a mask;

removing said first gate dielectric from unprotected second fins;

removing said mask from said first fins; and forming an additional gate dielectric on said second fins and on said first gate dielectric that covers said first fins to form different thicknesses of gate dielectrics on said first fins when compared to said second fins.

2. The method in claim 1, further comprising utilizing said fins in different types of transistors on said substrate, wherein one type of transistor includes gate dielectrics having a first thickness and a second type of transistor includes gate dielectrics having a second thickness different than said first thickness.

3. The method in claim 1, further comprising utilizing said fins in multiple-fin transistors.

4. The method in claim 1, wherein said process of forming an additional gate dielectric forms multiple layers of dielectric over said first fins and forms only said additional gate dielectric over said second fins.

5. The method in claim 1, wherein said process of patterning said fins forms a cap over said fins.

6. The method in claim 5, wherein said cap comprises a different material than said gate dielectrics.

7. A method of forming a fin-type field effect transistor (FinFET) structure, said method comprising:
    patterning fins on a substrate;
    forming a first gate dielectric on said fins;
    protecting first fins using a mask;
    removing said first gate dielectric from unprotected second fins;
    removing said mask from said first fins;
    forming an additional gate dielectric on said second fins and on said first gate dielectric that covers said first fins to form different thicknesses of gate dielectrics on said first fins when compared to said second fins and to form different fin thicknesses;
    doping ends of said fins to form source and drain regions separated by a central channel regions of said fins; and
    forming a gate conductor over said channel regions, wherein said gate dielectrics insulate said channel regions from said gate conductor.

8. The method in claim 7, further comprising utilizing said fins in different types of transistors on said substrate, wherein one type of transistor includes gate dielectrics having a first thickness and a second type of transistor includes gate dielectrics having a second thickness different than said first thickness.

9. The method in claim 7, further comprising utilizing said fins in multiple-fin transistors.

10. The method in claim 7, wherein said process of forming an additional gate dielectric forms multiple layers of dielectric over said first fins and forms said additional gate dielectric only over said second fins.

11. The method in claim 7, wherein said process of patterning said fins forms a cap over said fins.

12. The method in claim 11, wherein said cap comprises a different material than said gate dielectrics.

13. A method of forming a fin-type field effect transistor (FinFET) structure, said method comprising:
    patterning fins on a substrate;
    forming a first gate dielectric on said fins;
    protecting first fins using a mask;
    removing said first gate dielectric from unprotected second fins;
    removing said mask from said first fins;
    forming an additional gate dielectric on said second fins and on said first gate dielectric that covers said first fins to form different thicknesses of gate dielectrics on said first fins when compared to said second fins; and
    utilizing said fins in different types of transistors on said substrate, wherein one type of transistor includes gate dielectrics having a first thickness and a second type of transistor includes gate dielectrics having a second thickness different than said first thickness.

14. The method in claim 13, further comprising utilizing said fins in multiple-fin transistors.

15. The method in claim 13, wherein said process of forming an additional gate dielectric forms multiple layers of dielectric over said first fins and forms said additional gate dielectric only over said second fins.

16. The method in claim 13, wherein said process of patterning said fins forms a cap over said fins.

17. The method in claim 16, wherein said cap comprises a different material than said gate dielectrics.

* * * * *